United States Patent
Choi et al.

(10) Patent No.: US 7,463,511 B2
(45) Date of Patent: Dec. 9, 2008

(54) PHASE CHANGE MEMORY DEVICE USING MULTIPROGRAMMING METHOD

(75) Inventors: Byung-Gil Choi, Yongin-si (KR); Choong-Keun Kwak, Suwon-si (KR); Du-Eung Kim, Yongin-si (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 84 days.

(21) Appl. No.: 11/723,361

(22) Filed: Mar. 19, 2007

(65) Prior Publication Data

US 2007/0242503 A1    Oct. 18, 2007

(30) Foreign Application Priority Data

Apr. 12, 2006    (KR) ...................... 10-2006-0033305

(51) Int. Cl.
*G11C 11/00*    (2006.01)
(52) U.S. Cl. ................... 365/163; 365/214; 365/230.06
(58) Field of Classification Search ................. 365/163, 365/214, 230.06
See application file for complete search history.

(56) References Cited

U.S. PATENT DOCUMENTS

| | | | |
|---|---|---|---|
| 7,304,885 B2 * | 12/2007 | Cho et al. ................. | 365/163 |
| 2007/0058425 A1 * | 3/2007 | Cho et al. ................. | 365/163 |
| 2008/0025078 A1 * | 1/2008 | Scheuerlein et al. ....... | 365/163 |
| 2008/0025085 A1 * | 1/2008 | Scheuerlein et al. ...... | 365/185.02 |
| 2008/0137402 A1 * | 6/2008 | Cho et al. .................. | 365/163 |

* cited by examiner

*Primary Examiner*—Tuan T. Nguyen
(74) *Attorney, Agent, or Firm*—Volentine & Whitt, PLLC

(57) ABSTRACT

A phase change memory device includes a memory cell array and a write driver circuit, and a column selection circuit. The memory cell array includes a plurality of block units each connected between a corresponding pair of word line drivers. The write driver circuit includes a plurality of write driver units each comprising a plurality of write drivers adapted to provide respective programming currents to a corresponding block unit among the plurality of block units. The column selection circuit is connected between the memory cell array and the write driver circuit and is adapted to select at least one of the plurality of memory blocks in response to a column selection signal to provide corresponding programming currents to the at least one of the plurality of memory blocks.

15 Claims, 9 Drawing Sheets

Fig. 9
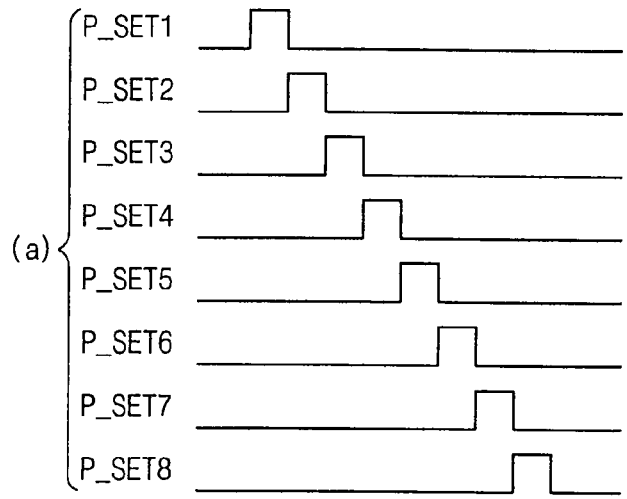
(a)
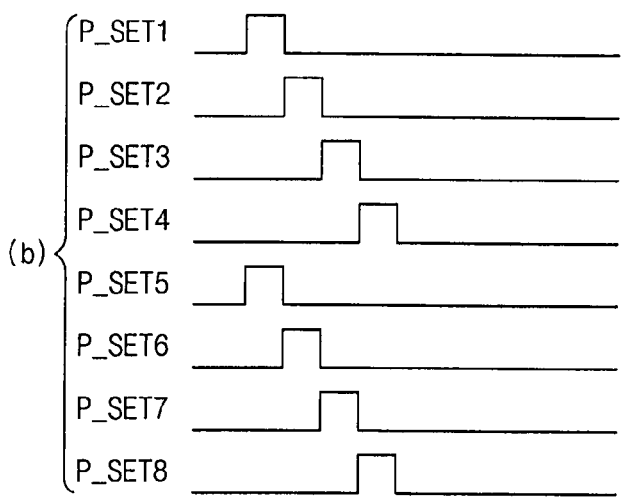
(b)
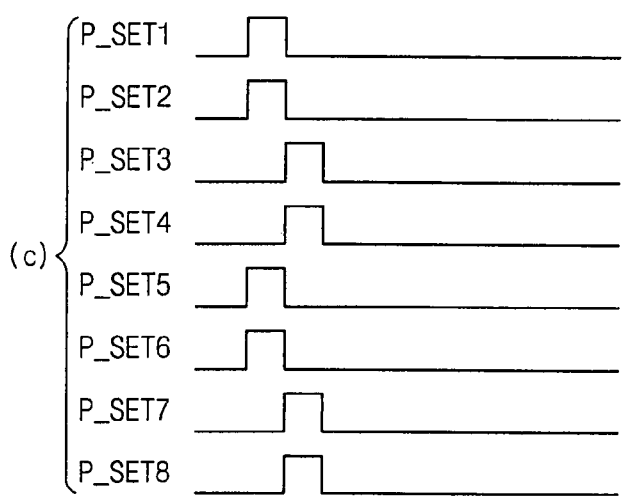
(c)

PHASE CHANGE MEMORY DEVICE USING MULTIPROGRAMMING METHOD

BACKGROUND OF THE INVENTION

1. Field of the Invention

Embodiments of the invention relate generally to semiconductor memory devices. More particularly, embodiments of the invention relate to phase change memory devices and related programming methods.

A claim of priority is made to Korean Patent Application No. 10-2006-0033305 filed on Apr. 12, 2006, the disclosure of which is hereby incorporated by reference in its entirety.

2. Description of Related Art

Phase change memory devices store data using phase change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

At least one type of phase change memory device—phase change random access memory (PRAM)—uses the amorphous state to represent a logical "1" and the crystalline state to represent a logical "0". In a PRAM device, the crystalline state is referred to as a "set state", and the amorphous state is referred to as a "reset state". Accordingly, a memory cell in a PRAM stores a logical "0" by "setting" a phase change material in the memory cell to the crystalline state, and the memory cell stores a logical "1" by "resetting" the phase change material to the amorphous state. Various PRAM devices are disclosed, for example, U.S. Pat. Nos. 6,487,113 and 6,480,438.

The phase change material in a PRAM is converted to the amorphous state by heating the material to above a predetermined melting temperature and then quickly cooling the material (See, e.g., curve "1" in FIG. 3). The phase change material is converted to the crystalline state by heating the material at another predetermined temperature below the melting temperature for a period of time (See, e.g., curve "2" in FIG. 3). Accordingly, data is written to memory cells in a PRAM by converting the phase change material in memory cells of the PRAM between the amorphous and crystalline states using heating and cooling as described.

The phase change material in a PRAM typically comprises a compound including germanium (Ge), antimony (Sb), and tellurium (Te), i.e., a "GST" compound. The GST compound is well suited for a PRAM because it can quickly transition between the amorphous and crystalline states by heating and cooling.

The memory cells in a PRAM are called "phase change memory cells". At least one type of phase change memory cell comprises a top electrode, a chalcogenide layer, a bottom electrode contact, a bottom electrode, and an access transistor or a diode, wherein the chalcogenide is the phase change material of the memory cell. Accordingly, a read operation is performed on the phase change memory cell by measuring the resistance of the chalcogenide layer, and a write operation is performed on the phase change memory cell by heating and cooling the chalcogenide layer as described above.

FIG. 1 is a circuit diagram illustrating a conventional phase change memory cell 10. Referring to FIG. 1, memory cell 10 includes a phase change resistance element 11 (also labeled "GST") comprising the GST compound, and a negative metal-oxide semiconductor (NMOS) transistor 12 (also labeled "NT"). Phase change resistance element 11 is connected between a bit line BL and NMOS transistor 12, and NMOS transistor 12 is connected between phase change resistance element 11 and ground. In addition, NMOS transistor 12 has a gate connected to a word line WL.

NMOS transistor 12 is turned on in response to a word line voltage applied to word line WL. Where NMOS transistor 12 is turned on, phase change resistance element 11 receives a current through bit line BL. Although phase change resistance element 11 is connected between bit line BL and NMOS transistor 12 in FIG. 1, phase change resistance element 11 could alternatively be connected between NMOS transistor 12 and ground.

FIG. 2 illustrates a conventional diode type phase change memory cell 20. Referring to FIG. 2, memory cell 20 comprises a phase change resistance element 21 (also labeled "GST") connected to a bitline BL, and a diode 22 (also labeled "D") connected between phase change resistance element 21 and a wordline WL.

Phase change memory cell 20 is accessed by selecting wordline WL and bitline BL. In order for phase change memory cell 20 to work properly, wordline WL must have a lower voltage level than bitline BL when wordline WL is selected so that current can flow through phase change resistance element 21. Diode 22 is forward biased so that if wordline WL has a higher voltage than bitline BL, no current flows through phase change resistance element 21. To ensure that wordline WL has a lower voltage level than bitline BL, wordline WL is generally connected to ground when selected.

In FIGS. 1 and 2, phase change resistance elements 11 and 21 can alternatively be broadly referred to as "memory elements" and NMOS transistor 12 and diode 22 can alternatively be broadly referred to as "select elements".

The operation of phase change memory cells 10 and 20 is described below with reference to FIG. 3. In particular, FIG. 3 is a graph illustrating temperature characteristics of phase change resistance elements 11 and 21 during programming operations of memory cells 10 and 20. In FIG. 3, a reference numeral "1" denotes temperature characteristics of phase change resistance elements 11 and 21 during a transition to the amorphous state, and a reference numeral "2" denotes temperature characteristics of phase change resistance elements 11 and 21 during a transition to the crystalline state.

Referring to FIG. 3, in a transition to the amorphous state, a current is applied to the GST compound in phase change resistance elements 11 and 21 for a duration T1 to increase the temperature of the GST compound above a melting temperature Tm. After duration T1, the temperature of the GST compound is rapidly decreased, or "quenched", and the GST compound assumes the amorphous state. On the other hand, in a transition to the crystalline state, a current is applied to the GST compound in phase change resistance elements 11 and 21 for an interval T2 (T2>T1) to increase the temperature of the GST compound above a crystallization temperature Tc (Tc <Tm) for a desired period of time. After interval T2, the GST compound is slowly cooled down below the crystallization temperature so that it assumes the crystalline state.

A phase change memory device typically comprises a plurality of phase change memory cells arranged in a memory cell array. Within the memory cell array, each of the memory cells is typically connected to a corresponding bit line and a corresponding word line. For example, the memory cell array may comprise bit lines arranged in columns and word lines arranged in rows, with a phase change memory cell located near each intersection between a column and a row.

Typically, a row of phase change memory cells connected to a particular word line are selected by applying an appropriate voltage level to the particular word line. For example, to select a row of phase change memory cells similar to phase change memory cell 10 illustrated in FIG. 1, a relatively high voltage level is applied to a corresponding word line WL to turn on NMOS transistor 12. Alternatively, to select a row of phase change memory cells similar to phase change memory cell 20 illustrated in FIG. 2, a relatively low voltage level is applied to a corresponding word line WL so that current can flow through diode 22.

Unfortunately, where a programming current is simultaneously applied to the plurality of memory cells connected with one word line, a voltage level of the word line may undesirably increase due to parasitic resistance and parasitic capacitance in the word line. As the voltage level of the word line increases, programming characteristics of the plurality of memory cells may deteriorate. For example, in the diode type phase change memory cell of FIG. 2, if the voltage level of word line WL increases undesirably, diode 22 may not completely turn on.

SUMMARY OF THE INVENTION

Accordingly, in recognition of at least the above problems with conventional phase change memory devices, selected embodiments of the invention provide phase change memory devices adapted to prevent word line voltages from increasing undesirably. In particular, various embodiments of the invention are designed to use a multiprogramming method, wherein a number of simultaneously programmed memory cells is limited to prevent word line voltages from increasing undesirably.

For example, according to one embodiment of the invention, a phase change memory device comprises a memory cell array, a write driver circuit, and a column selection circuit. The memory cell array comprises a plurality of block units and a plurality of word line drivers. Each of the plurality of block units is connected between a pair of adjacent word line drivers among the plurality of word line drivers and comprises a plurality of memory blocks. The write driver circuit comprises a plurality of write driver units, wherein each of the write driver units comprises a plurality of write drivers adapted to provide respective programming currents to a corresponding block unit among the plurality of block units. The column selection circuit is connected between the memory cell array and the write driver circuit and is adapted to select at least one of the plurality of memory blocks in response to a column selection signal to provide corresponding programming currents to at least one of the plurality of memory blocks.

BRIEF DESCRIPTION OF THE DRAWINGS

Embodiments of the invention are described in this written description with reference to the accompanying drawings. Throughout the drawings like reference numbers indicate like exemplary elements, components, and steps. In the drawings:

FIG. 9 includes waveform timing diagrams illustrating various multiprogramming methods used to program the phase change memory device illustrated in FIG. 4.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 4:
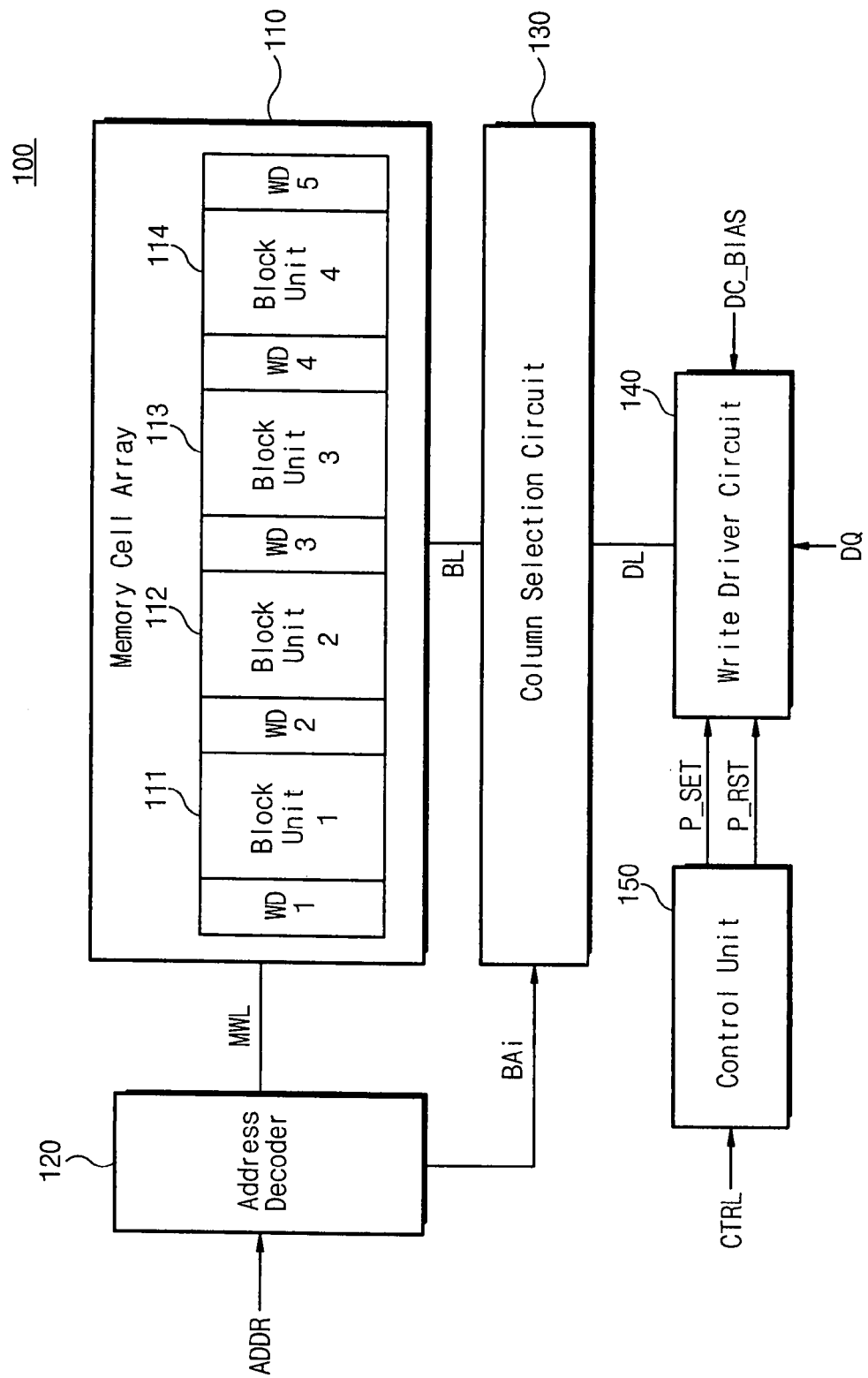
FIG. 4 is a block diagram of a phase change memory device according to one embodiment of the present invention.

FIG. 4 is a block diagram of a phase change memory device 100 according to one embodiment of the present invention. Referring to FIG. 4, phase change memory device 100 comprises a memory cell array 110, an address decoder 120, a column selection circuit 130, a write driver circuit 140, and a control unit 150.

Memory cell array 110 is connected to address decoder 120 via a plurality of main word lines MWL. In addition, memory cell array 110 is connected column selection circuit 130 via a plurality of bit lines BL. Memory cell array 110 comprises first through fourth block units 111 through 114 and first through fifth word line drivers WD1 through WD5. Each of first through fourth block units 111 through 114 comprises a plurality of memory blocks (See, e.g., elements 211 and 214 in FIG. 6) and is located between a pair of adjacent word line drivers among first through fifth word line drivers WD1 through WD5. For example, first block unit 111 is located between word line drivers WD1 and WD2.

Address decoder 120 decodes an address ADDR received from an external source. Address ADDR comprises a row address RA and a column address CA. Address decoder 120 decodes row address RA and selects a corresponding word line among main word lines MWL based on the decoded row address RA. Address decoder 120 decodes column address CA and generates a column selection signal BAi based on the decoded column address CA. Column selection circuit 130 receives column selection signal BAi and selects bit lines among bit lines BL corresponding to column address CA in response to column selection signal BAi.

Column selection circuit 130 is connected to write driver circuit 140 via a plurality of data lines DL. Column selection circuit 130 electrically connects data lines DL with the selected bit lines in response to column selection signal BAi.

Write driver circuit 140 receives program pulses including a plurality of set pulses P_SET and a plurality of reset pulses P_RST, data DQ, and a direct current (DC) bias voltage DC_BIAS. Control unit 150 provides set and reset pulses P_SET and P_RST and DC bias voltage DC_BIAS to write driver circuit 140, and a data input/output (IO) buffer (not shown) provides data DQ to write driver circuit 140. Control unit 150 typically generates set and reset pulses P_SET and P_RST under the control of various control signals such as a chip select signal /CS, a write enable signal /WE, and so on.

Write driver circuit 140 generates programming currents including set currents I_SET and reset currents I_RST and provides the programming currents to data lines DL in response to respective set and reset pulses P_SET and P_RST, data DQ, and DC bias voltage DC_BIAS. For example, write driver circuit 140 generates set currents I_SET in response to set pulses P_SET where corresponding input data bits among data DQ have a logic level "0" and generates reset currents I_RST in response to reset pulses P_RST where corresponding input data bits among data DQ have a logic level "1". In other words, write driver 140 generates respective set and reset currents I_SET and I_RST based on input data bits among data DQ and drives corresponding selected bit lines among bit lines BL with the set and reset currents I_SET and I_RST via data lines DL.

Figure 5:
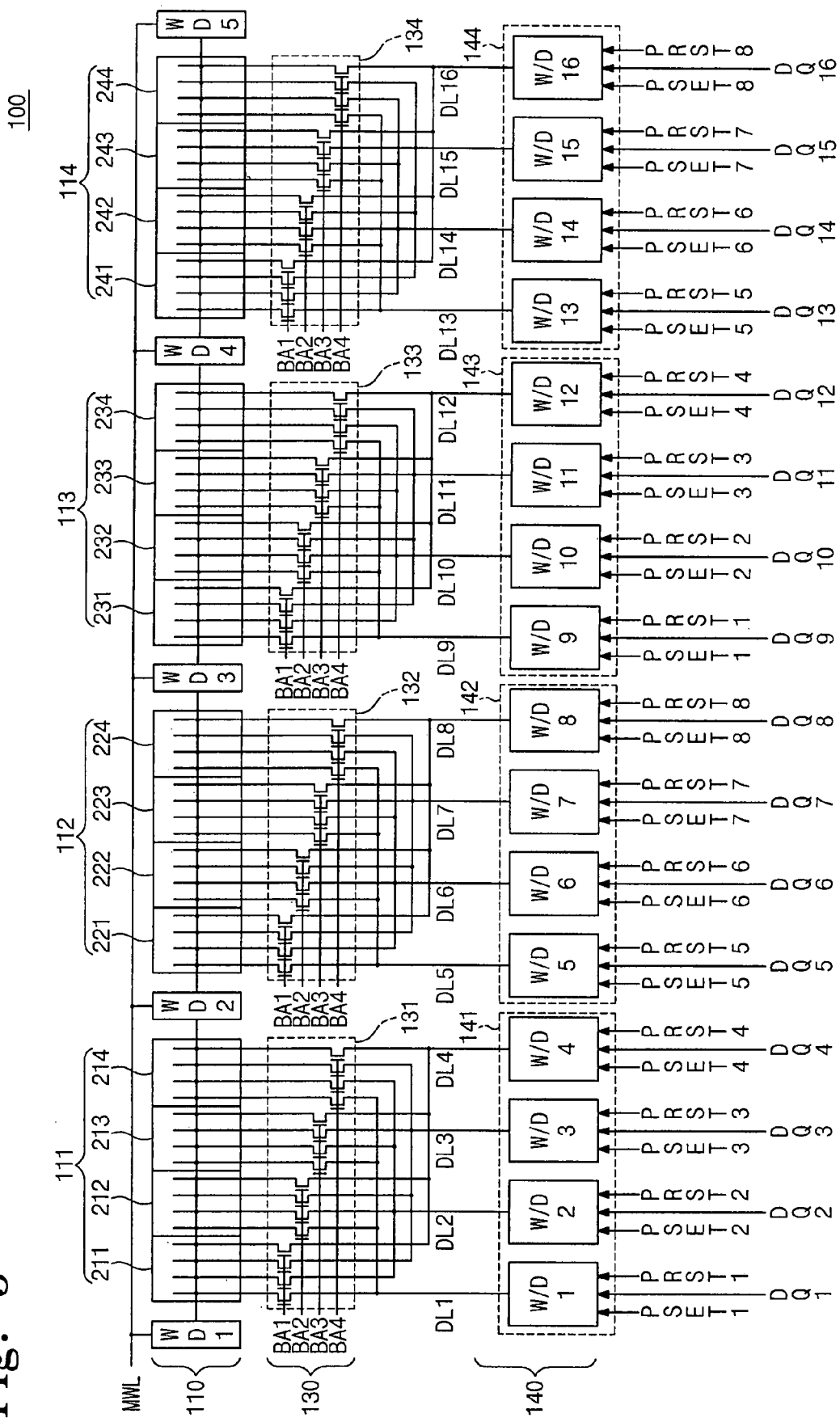
FIG. 5 is a block diagram illustrating various embodiments of features illustrated in the phase change memory device of FIG. 4.

FIG. 5 is a block diagram illustrating selected embodiments of memory cell array 110, column selection circuit 130, and write driver circuit 140 illustrated in FIG. 4.

In FIG. 5, each of first through fourth block units 111 through 114 comprises four memory blocks. For example, first block unit 111 comprises memory blocks 211 through 214. Moreover, each memory block within each of first through fourth block units 111 through 114 comprises a plurality of phase change memory cells.

Figure 6:
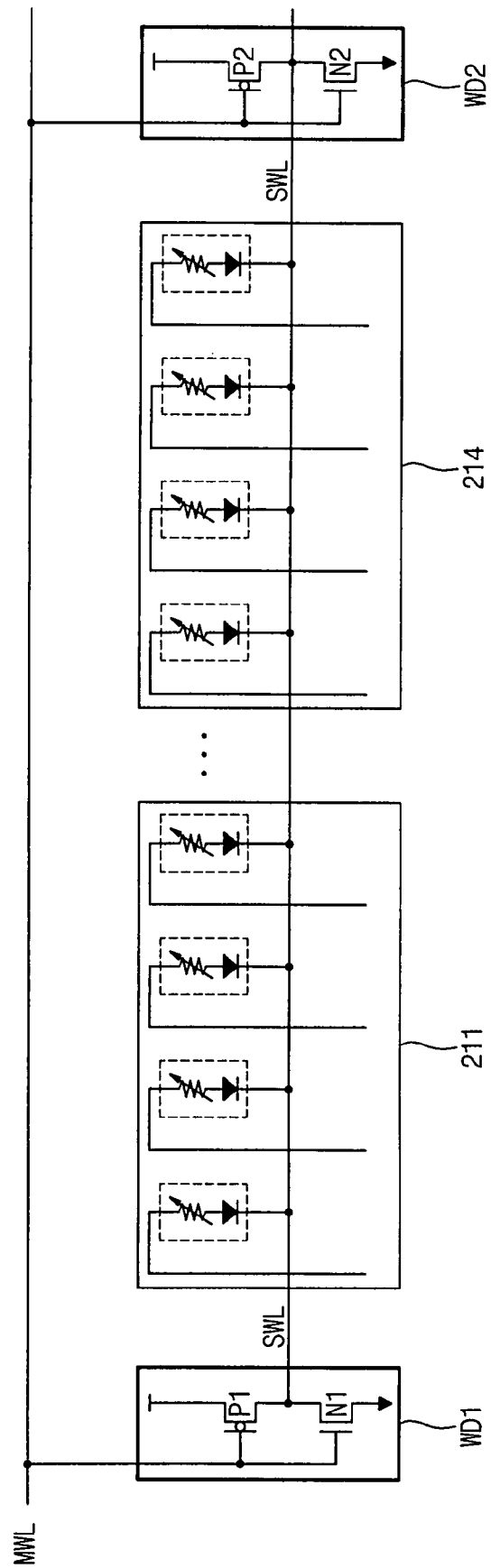
FIG. 6 is a circuit diagram illustrating an embodiment of a memory cell array illustrated in FIG. 5.

FIG. 6 illustrates one embodiment of memory blocks 211 through 214 in first block unit 111 and first and second word line drivers WD1 and WD2.

Referring to FIG. 6, first and second word line drivers WD1 and WD2 are both connected between a particular one of main word lines MWL and a sub word line SWL. Each of first and second word line drivers WD1 and WD2 comprises a positive metal-oxide semiconductor (PMOS) transistor and a negative metal-oxide semiconductor (NMOS) transistor. The PMOS transistor and the NMOS transistor include gates connected with the particular one of main word lines MWL and drains connected with sub word line SWL. Sub word line SWL has a logic level that varies according to a logic level of the particular one of main word lines MWL. For example, where the particular one of main word lines MWL has logic level "1", sub word line SWL assumes logic level "0". On the other hand, where the particular one of main word lines MWL has logic level "0", sub word line SWL assumes logic level "1".

Figure 1:
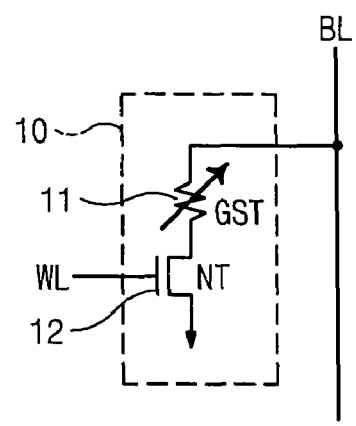
FIG. 1 is a circuit diagram illustrating one type of conventional phase change memory cell.
Figure 2:
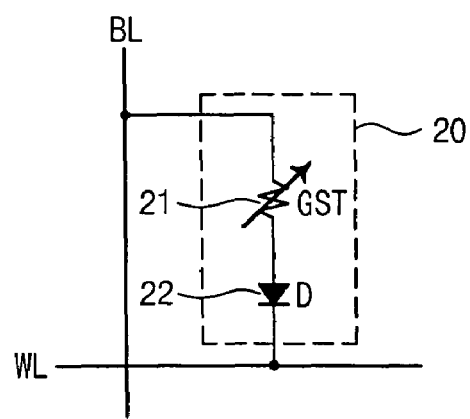
FIG. 2 is a circuit diagram illustrating another type of conventional phase change memory cell.
Figure 3:
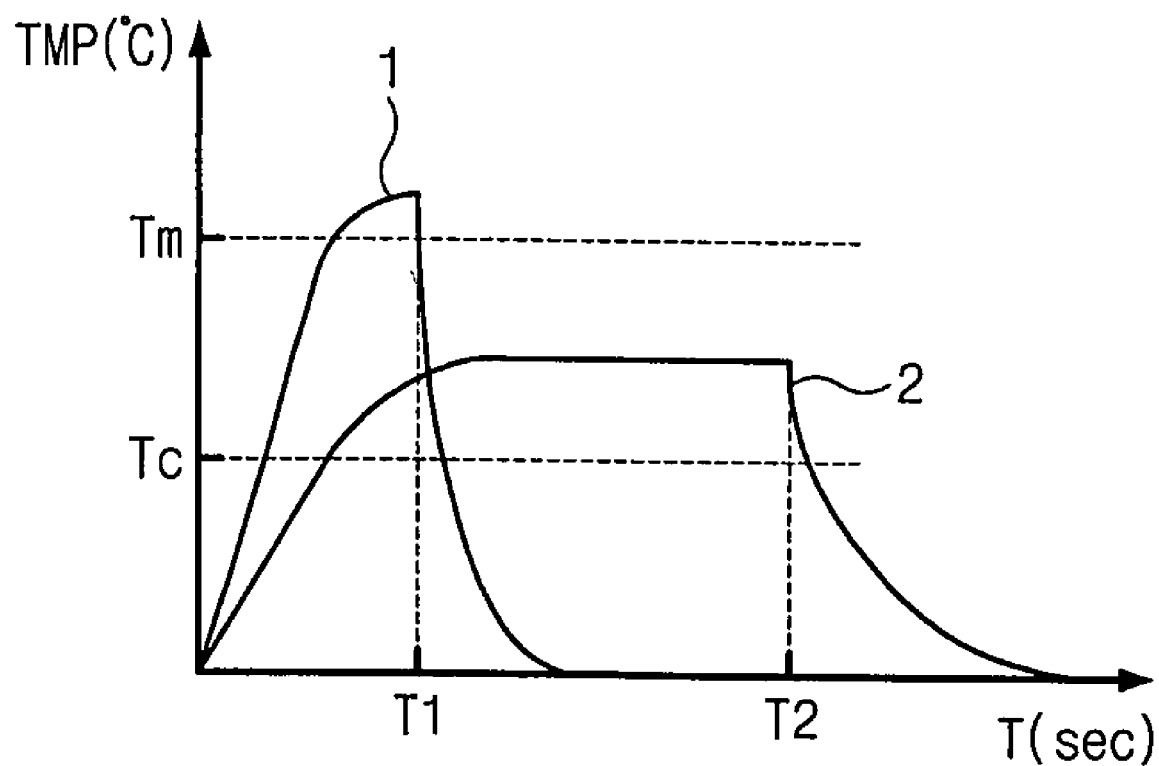
FIG. 3 is a graph illustrating temperature characteristics of a phase change material in the memory cells of FIGS. 1 and 2 during state transitions.

Memory blocks 211 through 214 each comprise a plurality of memory cells connected with sub word line SWL. Each of the plurality of memory cells shown in FIG. 6 is a diode type phase change memory cell such as that illustrated in FIG. 2, wherein a cathode of diode "D" is connected to sub word line SWL. However, alternatively, each of the plurality of memory cells shown in FIG. 6 could be a phase change memory cell including a NMOS transistor such as that illustrated in FIG. 1, wherein a gate of transistor NT is connected to sub word line SWL.

Referring again to FIG. 5, column selection circuit 130 is connected between bit lines BL and data lines DL. Column selection circuit 130 connects each of data lines DL with a corresponding one of the selected bit lines in response to column selection signal BAi. In the example of FIG. 5, column selection signal BAi is one of first through fourth column selection signals BA1 through BA4.

Column selection circuit 130 comprises first through fourth column selection units 131 through 134. First through fourth column selection units 131 through 134 are connected with first through fourth block units 111 through 114, respectively. Each of column selection units 131 through 134 comprises a plurality of NMOS transistors, and receives first through fourth column selection signals BA1 through BA4, which actuate the NMOS transistors. For example, first column selection unit 131 selects memory block 211 by turning NMOS transistors connected to bit lines corresponding to phase change memory cells in memory block 211 in response to first column selection signal BA1. Similarly, first column selection unit 131 selects second memory block 212 by turning NMOS transistors connected to bit lines corresponding to phase change memory cells in second memory block 212 in response to first column selection signal BA2, and so on.

Write driver circuit 140 comprises first through fourth write driver units 141 through 144. Each of write driver units 141 through 144 is adapted to provide set and reset currents I_SET and I_RST to a corresponding block unit among first through fourth block units 111 through 114. For example, first write driver unit 141 provides programming currents to first block unit 111, and second write driver unit 142 provides the programming current to second block unit 112.

Each of write driver units 141 through 144 comprises four write drivers. For example, first write driver unit 141 comprises first through fourth write drivers W/D1 through W/D4, second write driver unit 142 comprises fifth through eighth write driver units W/D5 through W/D8, and so on. Each of the write drivers in write driver units 141 through 144 receives a corresponding input data bit among data DQ. For example, write drivers W/D1 through W/D2 receive input data bits DQ1 through DQ4, respectively. In addition, each of the write drivers in write driver units 141 through 144 receives a corresponding set pulse among set pulses P_SET and a corresponding reset pulse among reset pulses P_RST. For example, write driver W/D1 receives set pulse P_SET1 and reset pulse P_RST1.

Each of the write drivers in write driver units 141 through 144 has substantially the same structure and functionality. Accordingly, as an example of the structure and functionality of the write drivers in write driver units 141 through 144, FIG. 7 exemplarily illustrates first write driver W/D1.

Figure 7:
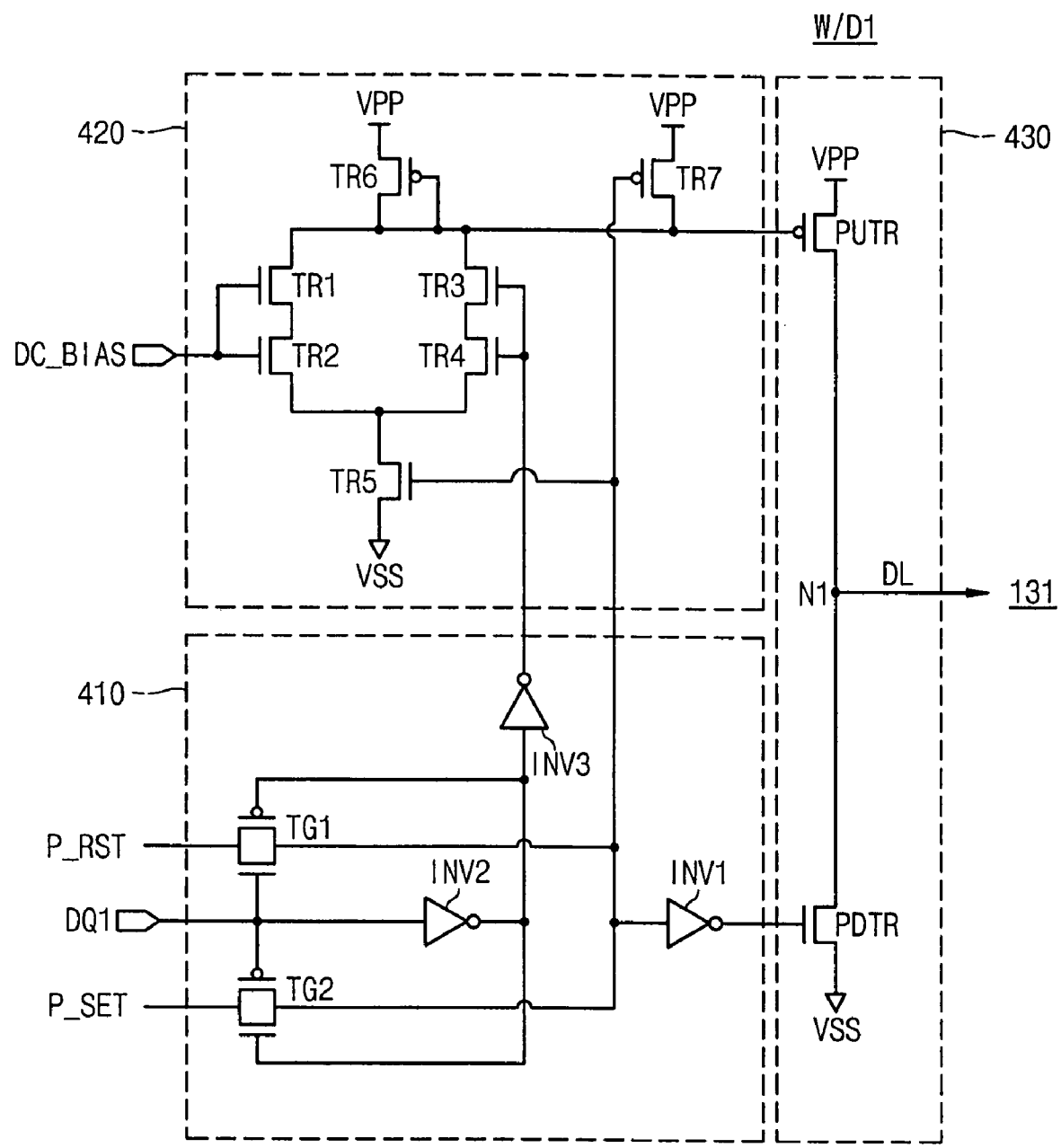
FIG. 7 is a circuit diagram illustrating an embodiment of a write driver illustrated in FIG. 5.

Referring to FIG. 7, write driver W/D1 comprises a pulse control circuit 410, a current control circuit 420, and a current driver circuit 430. Pulse control circuit 410 comprises first and second transfer gates TG1 and TG2 and first through third inverters INV1 through INV3. Current control circuit 420 comprises first through seventh transistors TR1 through TR7. First through fifth transistors TR1 through TR5 are NMOS transistors and sixth and seventh transistors TR6 and TR7 are PMOS transistors. Current driver circuit 430 comprises a pull-up transistor PUTR, which is a PMOS transistor, and a pull-down transistor PDTR, which is a NMOS transistor.

Where input data DQ1 has logic value "0", second transfer gate TG2 of pulse control circuit 410 is turned on and third and fourth transistors TR3 and TR4 of current control circuit 420 are turned off. Where second transfer gate TG2 is turned on, fifth transistor TR5, seventh transistor TR7, and pull-down transistor PDTR are actuated in accordance with set pulse P_SET1. For example, where second transfer gate TG2 is turned on and set pulse P_SET1 has logic level "1", fifth transistor TR5 is turned on and pull-down transistor PDTR and seventh transistor TR7 are turned off. As a result, a current flows through a first current path including transistors TR1, TR2, TR5 and TR6 and another similar current flows through pull-up transistor PUTR due to a current mirror effect. Current flowing through pull-up transistor PUTR is a set current I_SET1 and is provided to a selected memory cell MC through a corresponding data line DL1.

On the other hand, where the input data DQ1 has logic value "1" first transfer gate TG1 of pulse control circuit 410 and third and fourth transistors TR3 and TR4 of current control circuit 420 are turned on. Where first transfer gate TG1 is turned on, fifth transistor TR5, seventh transistor TR7, and pull-down transistor PDTR are actuated in accordance with reset pulse P_RST1. For example, where first transfer gate TG1 is turned on and reset pulse P_RST1 has logic level "1", fifth transistor TR5 is turned on and pull-down transistor PDTR and seventh transistor TR7 are turned off. As a result, a current flows through the first current path including transistors TR1, TR2, TR5 and TR6, and also through a second current path including transistors TR3, TR4, TR5 and TR6. A current proportional to the total current flowing through the first and second current paths flows through pull-up transistor PUTR due to a current mirror effect. Current flowing through pull-up transistor PUTR is a reset current I_RST1 and is provided to selected memory cell MC through data line DL1.

Reset current I_RST1 has a larger magnitude than set current I_SET1. In addition, reset pulse P_RST1 has a smaller pulse width than set pulse P_SET1. Accordingly, reset current I_RST1 has a larger magnitude but flows for a shorter period of time than set current I_SET1 based on the difference in width between reset pulse P_RST1 and set pulse P_SET1. Selected memory cell MC is programmed to the reset state or the set state by reset current I_RST1 or set current I_SET1, respectively.

Referring yet again to FIG. 5, first through fourth write driver units 141 through 144 provide programming currents to first through fourth block units 111 through 114, respectively. Where first column selection signal BA1 is activated, programming currents are provided to memory blocks 211, 221, 231 and 241. Similarly, where second column selection signal BA2 is activated, programming currents are provided to memory blocks 212, 222, 232 and 242, and so on.

Memory cells in first through fourth block units 111 through 114 can be programmed using a variety of different types of programming operations. For example, 16 bits of input data can be simultaneously programmed into memory cells within memory blocks 211, 221, 231 and 241, or in other words, four bits can be simultaneously programmed into each of respective memory blocks 211, 221, 231 and 241.

Figure 8:
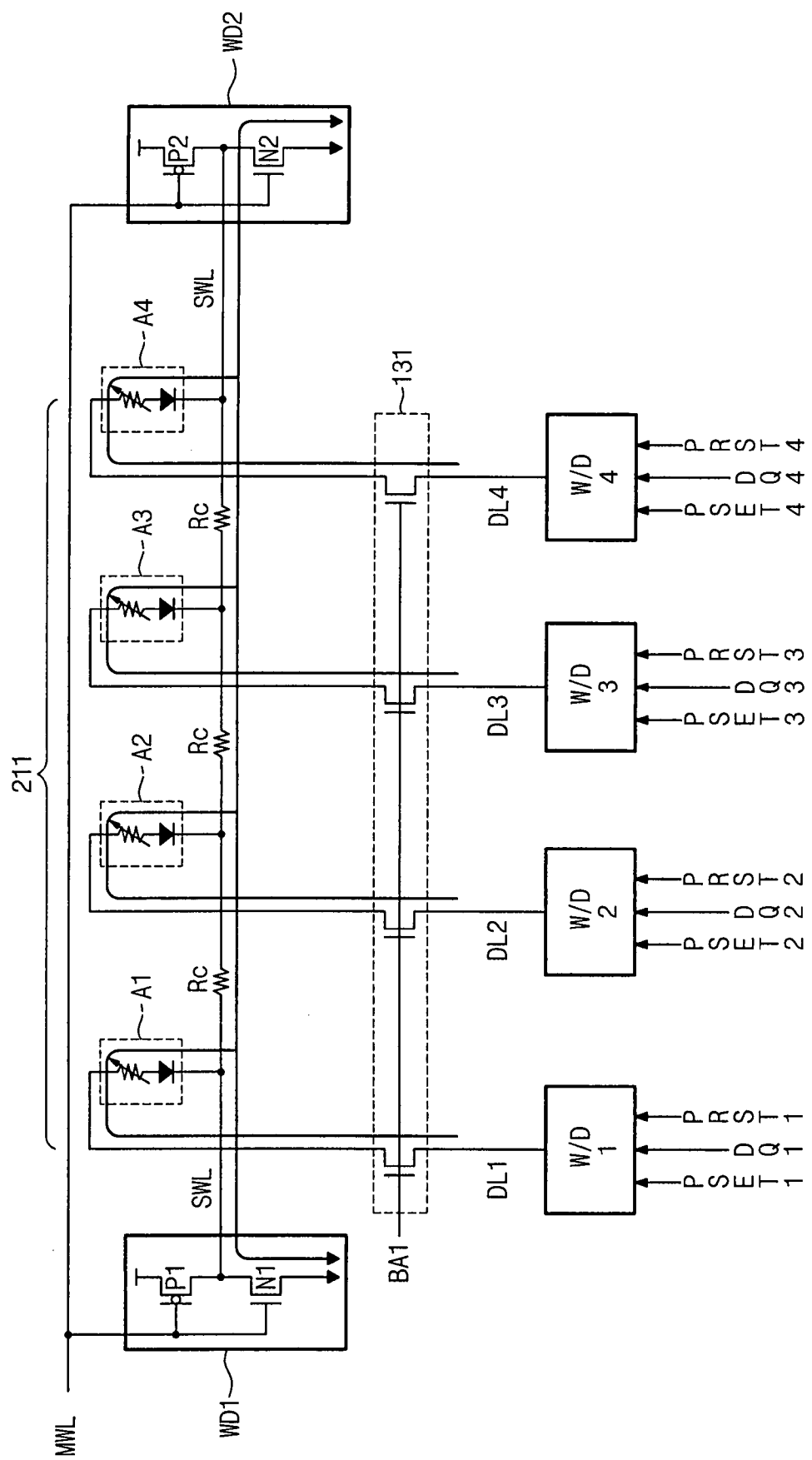
FIG. 8 is a block diagram illustrating a technique for simultaneously programming 16-bits of data into the phase change memory device illustrated in FIG. 4.

To illustrate a programming operation where 16 bits of input data are simultaneously programmed into memory cells within memory blocks 211, 221, 231 and 241, FIG. 8 illustrates the operation of memory block 211 where such a programming operation is performed.

Referring to FIG. 8, first column selection signal BA1 has logic level "1". As a result, four NMOS transistors within first column selection unit 131 are turned on. Four bits of input data DQ1 through DQ4 are simultaneously programmed in memory block 211 through respective first through fourth write drivers W/D1 through W/D4. Each of remaining memory blocks 221, 231 and 241 are simultaneously programmed in the same manner.

Memory block 211 comprises first through fourth memory cells A1 through A4 connected to respective first through fourth write drivers W/D1 through W/D4 via corresponding bit lines connected to the respective four NMOS transistors in first column selection unit 131.

First through fourth memory cells A1 through A4 each comprise a diode type phase change memory cell having diode with an anode connected to a phase change resistance element and a cathode connected to sub word line SWL. Programming currents are simultaneously applied to respective first through fourth memory cells A1 through A4 during the programming operation. Where a voltage difference between the anode and the cathode of each diode in any of first through fourth memory cells A1 through A4 is higher than a threshold voltage of the diode, the diode turns on. Where the diode turns on, a programming current is supplied to the corresponding memory cell through a corresponding bit line.

Unfortunately, however, where a programming current is simultaneously supplied to first through fourth memory cells A1 through A4, each diode in first through fourth memory cells A1 through A4 may not fully turn on. This is because the voltage level of sub word line SWL may increase due to parasitic resistances Rc con sub word line SWL. In other words, electric charges on sub word line SWL may not move to ground through NMOS transistors N1 and N2 in first and second word line drivers WD1 and WD2 due to parasitic resistances Rc. As a result, where the voltage level of sub word line SWL increases, programming characteristics of phase change memory device 100 tend to deteriorate.

In order to address this problem, phase change memory device 100 can program memory cells using a multiprogramming method. In the multiprogramming method, a number of memory cells to be programmed are subdivided into smaller groups and each of the smaller groups is programmed separately from the other groups. For example, instead of simultaneously programming sixteen memory cells as illustrated in FIG. 8, sets of two memory cells could be simultaneously programmed in eight successive programming cycles, or groups of four memory cells could be simultaneously programmed in four successive programming cycles, and so on. By programming the memory cells in smaller groups, the amount of current running through sub word line SWL at one time during programming operations tends to decrease, thereby decreasing the possibility of deteriorated programming characteristics due to an elevated voltage level of sub word line SWL.

FIG. 9 is a timing diagram illustrating various multiprogramming methods of phase change memory device 100. For purposes of FIG. 9, it will be assumed that phase change memory device 100 uses the implementations of various features as illustrated in FIG. 5.

Referring to FIGS. 5 and 9, set pulse P_SET1 and reset pulse P_RST1 are applied to first and ninth write drivers W/D1 and W/D9. Second program pulses P_SET2 and P_RST2 are applied to second and tenth write drivers W/D2 and W/D10, eighth program pulses P_SET8 and P_RST8 are applied to eighth and sixteenth write drivers W/D8 and W/D16, and so on. Although FIG. 9 only illustrates set pulses P_SET, reset pulses P_RST may be applied to corresponding memory cells in a manner similar to set pulses P_SET.

FIG. 9A illustrates a multiprogramming method wherein sixteen bits of input data are programmed into memory blocks among first through fourth block units 111 through 114 by simultaneously programming two bits of input data in eight successive program cycles wherein first through eighth set pulses P_SET1 through P_SET8 are activated (i.e., asserted using logic level "1") in sequence. This multiprogramming method will be referred to as a 2X multiprogramming method.

In the 2X multiprogramming method, first through fourth set pulses P_SET1 through P_SET4 are sequentially activated to program memory cells within first and third block units 111 and 113, and then fifth through eighth set pulses P_SET5 through P_SET8 are sequentially activated to program memory cells within second and fourth block units 112 and 114.

FIG. 9B illustrates a multiprogramming method wherein sixteen bits of input data are programmed into memory blocks among first through fourth block units 111 through 114 by simultaneously programming four bits of input data in four successive program cycles wherein four pairs of first through eighth set pulses P_SET1 through P_SET8 are activated in sequence. In particular, first and fifth set pulses P_SET1 and P_SET5 are simultaneously activated as a pair, second and sixth set pulses P_SET2 and P_SET6 are simultaneously activated as a pair, and so on. This multiprogramming method will be referred to as a 4X multiprogramming method. The 4X multiprogramming method is described in further detail below with reference to FIG. 10.

FIG. 9C illustrates a multiprogramming method wherein sixteen bits of input data are programmed into memory blocks among first through fourth block units 111 through 114 by simultaneously programming eight bits of input data in two successive program cycles wherein two quartets of first through eighth set pulses P_SET1 through P_SET8 are activated in sequence. In particular, first, second, fifth, and sixth set pulses P_SET1, P_SET2, P_SET5, and P_SET6 are simultaneously activated as a quartet, and third, fourth, seventh, and eighth set pulses P_SET3, P_SET4, P_SET7, and P_SET8 are simultaneously activated as a quartet. This multiprogramming method will be referred to as a 8X multiprogramming method.

Figure 10:
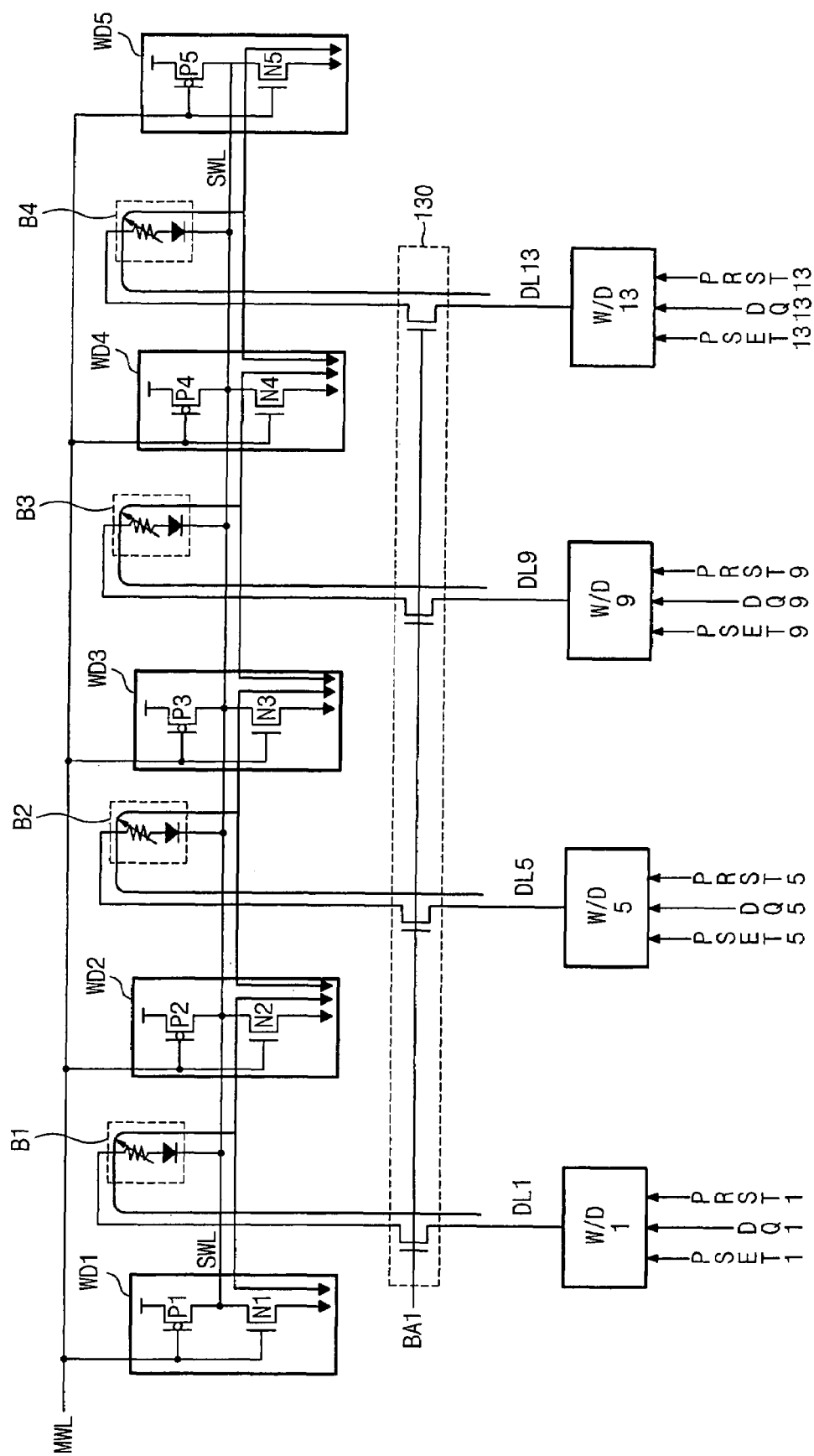
FIG. 10 is a block diagram illustrating a technique for simultaneously programming 4-bits of data into the phase change memory device illustrated in FIG. 4.

FIG. 10 illustrates the 4X multiprogramming operation described above in relation to FIG. 9B. In FIG. 10, it is assumed that first column selection signal BA1 has logic level "1" so that corresponding NMOS transistors in column selection circuit 130 are turned on. In the 4X multiprogramming method of FIG. 10, selected memory cells B1 through B4 are simultaneously programmed using write drivers W/D1, W/D5, W/D9 and W/D13. Selected memory cells B1 through B4 are included in respective first through fourth block units 111 through 114.

Where selected memory cells B1 through B4 are simultaneously programmed using the 4X programming method an amount of current flowing through sub word line SWL tends to be four times less than an amount of current flowing through sub word line SWL in the programming operation illustrated in FIG. 8. As a result, sub word line SWL tends to be less affected by parasitic resistances Rc when using the 4X multiprogramming method than in the programming operation illustrated in FIG. 8. As a result, the 4X multiprogramming method tends to prevent deterioration of programming characteristics of phase change memory device 100.

The foregoing exemplary embodiments are teaching examples. Those of ordinary skill in the art will understand that various changes in form and details may be made to the exemplary embodiments without departing from the scope of the invention as defined by the following claims.

What is claimed:

1. A phase change memory device, comprising:
a memory cell array comprising a plurality of block units and a plurality of word line drivers, wherein each of the plurality of block units is connected between a pair of adjacent word line drivers among the plurality of word line drivers and comprises a plurality of memory blocks;
a write driver circuit comprising a plurality of write driver units, wherein each of the write driver units comprises a plurality of write drivers adapted to provide respective programming currents to a corresponding block unit among the plurality of block units; and
a column selection circuit connected between the memory cell array and the write driver circuit and adapted to select at least one of the plurality of memory blocks in response to a column selection signal to provide corresponding programming currents to the at least one of the plurality of memory blocks.

2. The phase change memory device of claim 1, wherein each of the word line drivers is connected between a main word line and a sub word line and is adapted to drive the sub word line according to a voltage level of the main word line.

3. The phase change memory device of claim 2, wherein each of the word line drivers comprises:
a positive metal-oxide semiconductor (PMOS) transistor having a first terminal connected with a power source voltage, a second terminal connected to the sub word line, and a gate connected to the main word line; and
a negative metal-oxide semiconductor (NMOS) transistor having a first terminal connected to the sub word line, a second terminal connected to ground, and a gate connected to the main word line.

4. The phase change memory device of claim 2, wherein each of the memory blocks comprises a plurality of memory cells connected to the sub word line.

5. The phase change memory device of claim 4, wherein each of the plurality of memory cells comprises:
a memory element comprising a phase change material; and
a select element for selecting the memory cell.

6. The phase change memory device of claim 5, wherein the select element comprises a diode connected between the memory element and the sub word line.

7. The phase change memory device of claim 5, wherein the select element comprises a negative metal-oxide semiconductor (NMOS) transistor having a first terminal connected to the memory element, a second terminal connected to ground, and a gate connected to the sub word line.

8. The phase change memory device of claim 1, further comprising a control unit providing a plurality of program pulses to the write driver circuit.

9. The phase change memory device of claim 8, wherein the control unit sequentially activates the plurality of program pulses.

10. The phase change memory device of claim 8, wherein multiple program pulses among the plurality of program pulses are provided to each of the plurality of write driver units within the write driver circuit and the control unit simultaneously activates at least one program pulse provided to each of the write driver units.

11. The phase change memory device of claim 8, wherein the control unit activates the plurality of program pulses according to a multiprogramming method.

12. The phase change memory device of claim 11, wherein the multiprogramming method is one of 2X multiprogramming method, a 4X multiprogramming method, and an 8X multiprogramming method.

13. The phase change memory device of claim 1, wherein the column selection circuit comprises a plurality of column selection units and each of the column selection units is connected between a corresponding block unit among the plurality of block units and a corresponding write driver unit among the plurality of write driver units.

14. The phase change memory device of claim 13, wherein each of the column selection units comprises a plurality of negative metal-oxide semiconductor (NMOS) transistors actuated by the column selection signal.

15. The device of claim 13, wherein each of the write drivers comprises:
a pulse control circuit receiving an input data bit, a reset pulse, and a set pulse, and outputting one or more pulse control circuit output signals according to respective logic levels of the input data bit, the reset pulse, and the set pulse;
a current control circuit generating a control current in accordance with respective logic levels of the one or more pulse control circuit output signals; and
a current driver circuit generating a programming current in accordance with the respective logic levels of the input data bit, the set pulse, and the reset pulse, wherein the programming current has a magnitude proportional to a magnitude of the control current.

* * * * *